United States Patent
Song (10) Patent No.: US 9,774,318 B2
(45) Date of Patent: Sep. 26, 2017

(54) RAMP VOLTAGE GENERATOR AND IMAGE SENSING DEVICE INCLUDING THE SAME

(71) Applicant: SK hynix Inc., Gyeonggi-do (KR)

(72) Inventor: Jung-Eun Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 154 days.

(21) Appl. No.: 14/749,290

(22) Filed: Jun. 24, 2015

(65) Prior Publication Data

US 2016/0248409 A1    Aug. 25, 2016

(30) Foreign Application Priority Data

Feb. 24, 2015    (KR) .................. 10-2015-0025611

(51) Int. Cl.
| | |
|---|---|
| H03M 1/12 | (2006.01) |
| H04N 3/14 | (2006.01) |
| H04N 5/335 | (2011.01) |
| H03K 4/48 | (2006.01) |
| H04N 5/374 | (2011.01) |
| H04N 5/378 | (2011.01) |

(52) U.S. Cl.
CPC ............... *H03K 4/48* (2013.01); *H04N 5/374* (2013.01); *H04N 5/378* (2013.01)

(58) Field of Classification Search
CPC ........... G05B 2219/21137; G05B 2219/35561; G05B 2219/21124; H04N 5/378; H04N 5/37455; H04N 5/37452; H03M 1/001; H03M 1/004; H03M 1/56; H03M 1/825; H03K 6/04
USPC ............................ 341/126–172; 348/294–302
See application file for complete search history.

(56) References Cited

U.S. PATENT DOCUMENTS

| | | | | |
|---|---|---|---|---|
| 4,167,763 A * | 9/1979 | Kubota | .................. | G11B 5/588 360/266 |
| 7,091,795 B1 * | 8/2006 | Tsyrganovich | ......... | H03L 7/199 327/156 |
| 8,203,477 B2 * | 6/2012 | Lee | ..................... | H03M 1/1225 323/222 |
| 8,773,552 B2 * | 7/2014 | Egawa | .................. | H04N 5/378 250/208.1 |
| 8,878,954 B2 * | 11/2014 | Hashimoto | ............ | H04N 5/225 341/155 |
| 8,922,403 B2 * | 12/2014 | Gou | ..................... | H03M 1/0607 341/118 |

(Continued)

FOREIGN PATENT DOCUMENTS

KR    1020140093262    7/2014

OTHER PUBLICATIONS

Bae et al., A Two-Step A/D Conversion and Column Self-Calibration Technique for Low Noise CMOS Image Sensors, Sensors 2014, Jul. 4, 2014, p. 11825-11843, vol. 14, Issue 7, MDPI.

*Primary Examiner* — Chia-Wei A Chen
(74) *Attorney, Agent, or Firm* — IP & T Group LLP (57) ABSTRACT

A ramp voltage generator includes a first ramp voltage generation block suitable for generating a first ramp voltage with a first slope in response to a bias signal and a first ramp control signal, and a second ramp voltage generation block suitable for generating a second ramp voltage with a second slope corresponding to the first slope in response to the bias signal, a second ramp control signal, and a slope correction signal.

20 Claims, 6 Drawing Sheets

(56) References Cited

U.S. PATENT DOCUMENTS

| | | | | |
|---|---|---|---|---|
| 2007/0046513 A1* | 3/2007 | Ham | ................. | H03M 1/58 341/118 |
| 2007/0080838 A1* | 4/2007 | Asayama | ............. | H03M 1/0863 341/144 |
| 2007/0194962 A1* | 8/2007 | Asayama | ............. | H03M 1/1014 341/144 |
| 2008/0116871 A1* | 5/2008 | Li | ................. | H02M 3/157 323/283 |
| 2008/0252767 A1* | 10/2008 | Muramatsu | .......... | H03M 1/1023 348/312 |
| 2008/0272952 A1* | 11/2008 | Wood | ............... | G04F 10/005 341/166 |
| 2009/0066554 A1* | 3/2009 | Lim | ................. | H03M 1/144 341/155 |
| 2010/0253559 A1* | 10/2010 | Dasnurkar | .......... | H03K 4/501 341/121 |
| 2011/0240833 A1* | 10/2011 | Gravot | .............. | H03M 1/145 250/208.2 |
| 2012/0006974 A1* | 1/2012 | Egawa | ............... | H04N 5/3742 250/208.1 |
| 2012/0050082 A1* | 3/2012 | Danesh | .............. | H03M 1/1215 341/122 |
| 2012/0098687 A1* | 4/2012 | Wilhite | ............. | H03M 1/109 341/120 |
| 2013/0021493 A1* | 1/2013 | Ishibashi | ............ | H04N 5/335 348/222.1 |
| 2013/0063101 A1* | 3/2013 | Nene | ................ | H03K 4/026 323/234 |
| 2013/0271221 A1* | 10/2013 | Levesque | ............ | H03F 3/193 330/294 |
| 2014/0036124 A1* | 2/2014 | Higuchi | ............. | H04N 5/378 348/302 |
| 2015/0181146 A1* | 6/2015 | Hashimoto | ........... | H04N 5/378 348/229.1 |
| 2015/0244388 A1* | 8/2015 | Hashimoto | ........... | H03M 1/34 348/322 |
| 2015/0249797 A1* | 9/2015 | Yui | ................... | H04N 5/3575 250/208.1 |
| 2015/0350585 A1* | 12/2015 | Kim | .................. | H04N 5/378 348/308 |
| 2015/0357908 A1* | 12/2015 | Ekbote | .............. | H05B 33/0815 315/201 |
| 2016/0219229 A1* | 7/2016 | Kimura | .............. | H04N 5/378 |

* cited by examiner

RAMP VOLTAGE GENERATOR AND IMAGE SENSING DEVICE INCLUDING THE SAME

CROSS-REFERENCE TO RELATED APPLICATIONS

The present application claims priority of Korean Patent Application No. 10-2015-0025611, filed on Feb. 24, 2015, which is incorporated herein by reference in its entirety.

BACKGROUND

1. Field

Exemplary embodiments of the present invention relate to a semiconductor design technology and, more particularly, to a ramp voltage generator and an image sensing device including the same.

2. Description of the Related Art

Image sensing devices capture images using photosensitive properties of semiconductors. Image sensing devices are often classified into charge-coupled device (CCD) image sensors and complementary metal-oxide semiconductor (CMOS) image sensors. CMOS image sensors allow for both analog and digital control circuits to be directly realized on a single integrated circuit (IC), making CMOS image sensors the most widely used type of image sensor.

Electronic devices such mobile phones may be fabricated with built-in image sensing devices. The image sensing devices need to perform high speed operations to improve overall performance of the mobile apparatus. This has resulted in many specialized technologies being developed for image sensing devices. Particularly, technologies for reducing analog-to-digital converter (hereinafter, referred to as "ADC") readout times of image sensing devices are being proposed.

For example, a 2-step ADC developed from a single-slope ADC has been proposed. The single-slope ADC requires a clock with a cycle of "$2^{10}=1024$" in order to output a digital signal of 10 bits, but the 2-step ADC requires a clock with a cycle of "$2^3+2^7=136$" by outputting 3 bits of the digital signal using a coarse clock and outputting the other 7 bits of the digital signal using a fine clock. Ideally, the readout time can be reduced by a ratio of "136/1024". Since the coarse clock has a frequency lower than that of the fine clock in order to ensure the settling time of the coarse clock, the readout time is longer than the ideal readout time. However, the readout time of the 2-step ADC may be effectively reduced compared with the readout time of the single-slope ADC. In addition, since the 2-step ADC may be realized in a small area, it has been favored as a technology that can be applied to image sensing devices with a high number of pixels that operate at high speed.

The 2-step ADC uses a coarse ramp voltage corresponding to the coarse clock and a fine ramp voltage corresponding to the fine clock. For example, the 2-step ADC outputs a digital signal of 3 bits corresponding to a voltage level of a pixel signal, which is an analog signal, based on the coarse ramp voltage having a predetermined slope, and then outputs a digital signal of 7 bits corresponding to the voltage level of the pixel signal based on the fine ramp voltage having the predetermined slope. Typically, an image sensing device includes a ramp voltage generator for generating the coarse ramp voltage and the fine ramp voltage.

Figure 1:
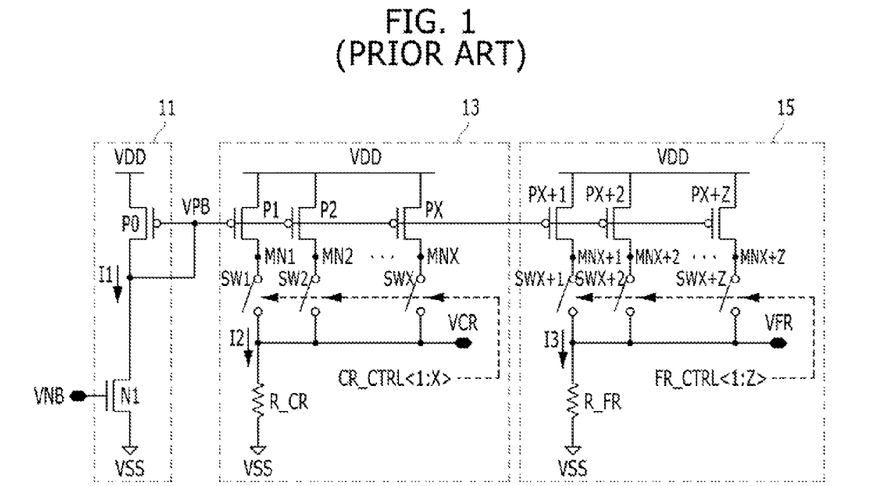
FIG. 1 is an internal configuration diagram of a conventional ramp voltage generator.

FIG. 1 illustrates an Internal configuration diagram of a ramp voltage generator.

Referring to FIG. 1, the ramp voltage generator includes a source current generation unit 11, a coarse ramp voltage generation unit 13, and a fine ramp voltage generation unit 15.

The source current generation unit 11 generates a first source current I1 in response to a first bias signal VNB, and generates a second bias signal VPB corresponding to the first source current I1.

For example, the source current generation unit 11 includes a first sinking section N1 and a first sourcing section P0. The first sinking section N1 is coupled between an output terminal of the second bias signal VPB and a ground voltage terminal VSS, and makes the first source current I1 sink to the ground voltage terminal VSS in response to the first bias signal VNB. For example, the first sinking section N1 includes a NMOS transistor having a gate coupled to an input terminal of the first bias signal VNB, and a drain and a source coupled between the output terminal of the second bias signal VPB and the ground voltage terminal VSS. The first sourcing section P0 is coupled between a power supply voltage terminal VDD and the output terminal of the second bias signal VPB, and makes the source current I1 sourced from the power supply voltage terminal VDD in response to the second bias signal VPB. For example, the first sourcing section P0 Includes a PMOS transistor having a gate and a drain coupled to the output terminal of the second bias signal VPB, and a source coupled to the power supply voltage terminal VDD.

The coarse ramp voltage generation unit 13 generates a first mirror current I2 varied by a coarse unit (for example, corresponding to 128 least significant bits (LSB)) in response to the second bias signal VPB and first to $X^{th}$ coarse ramp control signals CR_CTRL<1:X>, and generates a coarse ramp voltage VCR based on the first mirror current I2.

For example, the coarse ramp voltage generation unit 13 includes a first mirroring section P1 to PX, a first switching section SW1 to SWX, and a first resistor section R_CR. The first mirroring section P1 to PX is coupled between the power supply voltage terminal VDD and first to $X^{th}$ mirroring nodes MN1 to MNX, and resources the first mirror current I2 in response to the second bias signal VPB. For example, the first mirroring section P1 to PX includes first to $X^{th}$ PMOS transistors respectively having gates coupled to an input terminal of the second bias signal VPB and sources and drains coupled between the power supply voltage terminal VDD and the first to $X^{th}$ mirroring nodes MN1 to MNX. The first switching section SW1 to SWX is coupled between the first to $X^{th}$ mirroring nodes MN1 to MNX and an output terminal of the coarse ramp voltage VCR, and generates the first mirror current I2 decreased by the coarse unit during a coarse conversion period in response to the first to $X^{th}$ coarse ramp control signals CR_CTRL<1:X>. For example, the first switching section SW1 to SWX includes first to $X^{th}$ switching elements which are sequentially open during the coarse conversion period in response to the first to $X^{th}$ coarse ramp control signals CR_CTRL<1:X>. The first resistor section R_CR may be coupled between the output terminal of the coarse ramp voltage VCR and the ground voltage terminal VSS. For example, the first resistor section R_CR includes a resistance element.

The fine ramp voltage generation unit 15 generates a second mirror current I3 varied by a fine unit (for example, corresponding to 1 LSB) in response to the second bias signal VPB and first to $Z^{th}$ fine ramp control signals FR_CTRL<1:Z>, and generates a fine ramp voltage VFR based on the second mirror current I3.

For example, the fine ramp voltage generation unit 15 includes a second mirroring section PX+1 to PX+Z, a second switching section SWX+1 to SWX+Z, and a second resistor section R_FR. The second mirroring section PX+1 to PX+Z is coupled between the power supply voltage terminal VDD and $(X+1)^{th}$ to $(X+Z)^{th}$ mirroring nodes MNX+1 to MNX+Z, and resources the second mirror current I3 in response to the second bias signal VPB. For example, the second mirroring section PX+1 to PX+Z includes $(X+1)^{th}$ to $(X+Z)^{th}$ PMOS transistors respectively having gates coupled to the input terminal of the second bias signal VPB and sources and drains coupled between the power supply voltage terminal VDD and the $(X+1)^{th}$ to $(X+Z)^{th}$ mirroring nodes MNX+1 to MNX+Z. The second switching section SWX+1 to SWX+Z is coupled between the $(X+1)^{th}$ to $(X+Z)^{th}$ mirroring nodes MNX+1 to MNX+Z and an output terminal of the fine ramp voltage VFR, and generates the second mirror current I3 increased by the fine unit during a fine conversion period in response to the first to $Z^{th}$ fine ramp control signals FR_CTRL<1:Z>. For example, the second switching section SWX+1 to SWX+Z includes $(X+1)^{th}$ to $(X+Z)^{th}$ switching elements which are sequentially closed during fine conversion period in response to the first to $Z^{th}$ fine ramp control signals FR_CTRL<1:Z>. The second resistor section R_FR may be coupled between the output terminal of the fine ramp voltage VFR and the ground voltage terminal VSS. For example, the second resistor section R_FR includes a resistance element.

An image sensing device configured as above may have a mismatch between the coarse ramp voltage generation unit 13 and the fine ramp voltage generation unit 15. For example, a process mismatch occurs between the first to $X^{th}$ PMOS transistors included in the first mirroring sections P1 to PX and the $(X+1)^{th}$ to $(X+Z)^{th}$ PMOS transistors included in the second mirroring sections PX+1 to PX+Z, or a process mismatch occurs between a load resistor of the coarse ramp voltage generation unit 13 and a load resistor of the fine ramp voltage generation unit 15.

Figure 2:
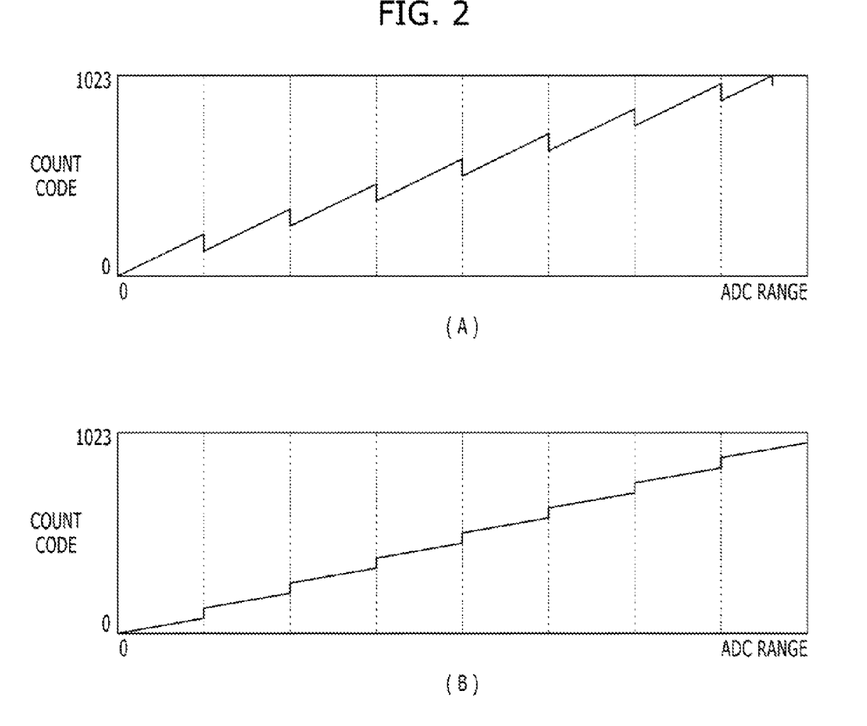
FIG. 2 is a graph for explaining the operation of a ramp voltage generator illustrated in FIG. 1.

For this reason, when a mismatch occurs between the coarse ramp voltage generation unit 13 and the fine ramp voltage generation unit 15, a mismatch also occurs between the coarse ramp voltage VCR and the fine ramp voltage VFR. In this case, a circuit using the coarse ramp voltage VCR and the fine ramp voltage VFR, for example, the 2-step ADC outputs a digital signal corresponding to a missing code. Graphs (A) and (B) of FIG. 2 illustrate the relation between the range of an analog signal (that is, ADC range) and a corresponding digital signal (i.e., count code) to which the 2-step ADC may convert the analog signal. For example, when the slope of the fine ramp voltage VFR is lower than that of the coarse ramp voltage VCR, a linearity error may occur as illustrated in graph (A) of FIG. 2. When the slope of the fine ramp voltage VFR is higher than that of the coarse ramp voltage VCR, a linearity error may occur as illustrated in graph (B) of FIG. 2.

Therefore, when the aforementioned linearity error occurs, the 2-step ADC outputs a digital signal corresponding to a missing code in converting an analog signal.

SUMMARY

Various embodiments are directed to a ramp voltage generator capable of correcting a mismatch between a coarse ramp voltage and a fine ramp voltage and an image sensing device including the same.

In an embodiment, a ramp voltage generator may include a first ramp voltage generation block suitable for generating a first ramp voltage with a first slope in response to a bias signal and a first ramp control signal, and a second ramp voltage generation block suitable for generating a second ramp voltage with a second slope corresponding to the first slope in response to the bias signal, a second ramp control signal, and a slope correction signal.

The second slope may be substantially equal to the first slope.

The ramp voltage generator may further include a correction block suitable for storing the slope correction signal.

The first ramp control signal may be generated based on a first clock, and the second ramp control signal may be generated based on a second clock with a frequency higher than the frequency of the first clock.

In an embodiment, a ramp voltage generator may include a first source current generation unit suitable for generating a first source current in response to a first bias signal, and generating a second bias signal corresponding to the first source current, a first ramp voltage generation unit suitable for generating a first mirror current varied by a coarse unit in response to the second bias signal and a coarse ramp control signal, and generating a coarse ramp voltage having a first slope based on the first mirror current, a second source current generation unit suitable for generating a second source current corrected based on the first slope in response to the first bias signal and a slope correction signal, and generating a third bias signal corresponding to the second source current, and a second ramp voltage generation unit suitable for generating a second mirror current varied by a fine unit in response to the third bias signal and a fine ramp control signal, and generating a fine ramp voltage having the first slope based on the second mirror current.

The second source current generation unit may include a second sinking section coupled between an output terminal of the third bias signal and a ground voltage terminal, wherein the second source current sinks to the ground voltage terminal in response to the first bias signal, a plurality of second sourcing sections coupled between a power supply voltage terminal and a plurality of second sourcing nodes, respectively, wherein the second source current is sourced from the power supply voltage terminal in response to the third bias signal, and a plurality of second switching sections coupled between the plurality of second sourcing nodes, respectively, and the output terminal of the third bias signal, and suitable for being selectively switched in response to the slope correction signal.

The second ramp voltage generation unit may include a second mirroring section coupled between a power supply voltage terminal and a plurality of second mirroring nodes, wherein the second source current is sourced from the power supply voltage terminal in response to the third bias signal; a third switching section coupled between the plurality of second mirroring nodes and an output terminal of the fine ramp voltage, and suitable for being sequentially switched in response to the fine ramp control signal, and a second resistor section coupled between the output terminal of the fine ramp voltage and a ground voltage terminal.

The ramp voltage generator may further include a storage unit suitable for storing the slope correction signal.

The first source current generation unit may include a first sinking section coupled between an output terminal of the second bias signal and a ground voltage terminal, wherein the first source current sinks to the ground voltage terminal in response to the first bias signal, and a first sourcing section coupled between a power supply voltage terminal and the output terminal of the second bias signal, wherein the first source current is sourced from the power supply voltage terminal in response to the second bias signal.

The first ramp voltage generation unit may include a first mirroring section coupled between a power supply voltage terminal and a plurality of first mirroring nodes, wherein the first source current is sourced from the power supply voltage terminal in response to the second bias signal, a first switching section coupled between the plurality of first mirroring nodes and an output terminal of the coarse ramp voltage, and suitable for being sequentially switched in response to the coarse ramp control signal, and a first resistor section coupled between the output terminal of the coarse ramp voltage and a ground voltage terminal.

The coarse ramp control signal may be generated based on a first clock, and the fine ramp control signal may be generated based on a second clock with a frequency higher than the frequency of the first clock.

In an embodiment, an image sensing device may include a pixel array suitable for generating an image signal, an analog-to-digital converter suitable for generating a digital signal corresponding to the image signal by using a coarse ramp voltage and a fine ramp voltage, and a ramp voltage generator suitable for generating the coarse ramp voltage having a first slope and the fine ramp voltage having a second slope corrected based on the first slope in response to a bias signal, a coarse ramp control signal, and a fine ramp control signal.

The second slope may be substantially equal to the first slope.

The ramp voltage generator may include a correction block suitable for storing a slope correction signal, a first ramp voltage generation block suitable for generating the coarse ramp voltage in response to the bias signal and the coarse ramp control signal, and a second ramp voltage generation block suitable for generating the fine ramp voltage in response to the bias signal, the fine ramp control signal, and the slope correction signal.

The second ramp voltage generation block may include a second source current generation unit suitable for generating a second source current corrected based on the first slope in response to a first bias signal and the slope correction signal, and generating a third bias signal corresponding to the second source current, and a second ramp voltage generation unit suitable for generating a second mirror current varied by a fine unit in response to the third bias signal and the fine ramp control signal, and generating the fine ramp voltage based on the second mirror current.

The second source current generation unit may include a second sinking section coupled between an output terminal of the third bias signal and a ground voltage terminal, wherein the second source current sinks to the ground voltage terminal in response to the first bias signal, a plurality of second sourcing sections coupled between a power supply voltage terminal and a plurality of second sourcing nodes, respectively, wherein the second source current is sourced from the power supply voltage terminal in response to the third bias signal, and a plurality of second switching sections coupled between the plurality of second sourcing nodes, respectively, and the output terminal of the third bias signal, and suitable for being selectively switched in response to the slope correction signal.

The second ramp voltage generation unit may include a second mirroring section coupled between a power supply voltage terminal and a plurality of second mirroring nodes, wherein the second source current is sourced from the power supply voltage terminal in response to the third bias signal, a third switching section coupled between the plurality of second mirroring nodes and an output terminal of the fine ramp voltage, and suitable for being sequentially switched in response to the fine ramp control signal, and a second resistor section coupled between the output terminal of the fine ramp voltage and a ground voltage terminal.

The first ramp voltage generation block may include a first source current generation unit suitable for generating a first source current in response to a first bias signal, and generating a second bias signal corresponding to the first source current, and a first ramp voltage generation unit suitable for generating a first mirror current varied by a coarse unit in response to the second bias signal and the coarse ramp control signal, and generating the coarse ramp voltage based on the first mirror current.

The first source current generation unit may include a first sinking section coupled between an output terminal of the second bias signal and a ground voltage terminal, wherein the first source current sinks to the ground voltage terminal in response to the first bias signal, and a first sourcing section coupled between a power supply voltage terminal and the output terminal of the second bias signal, wherein the first source current is sourced from the power supply voltage terminal in response to the second bias signal.

The first ramp voltage generation unit may include a first mirroring section coupled between a power supply voltage terminal and a plurality of first mirroring nodes, wherein the first source current is sourced from the power supply voltage terminal in response to the second bias signal, a first switching section coupled between the plurality of first mirroring nodes and an output terminal of the coarse ramp voltage, and suitable for being sequentially switched in response to the coarse ramp control signal, and a first resistor section coupled between the output terminal of the coarse ramp voltage and a ground voltage terminal.

In accordance with the embodiment of the present invention, a mismatch between a coarse ramp voltage and a fine ramp voltage is corrected, so that the linearity of the slope of the coarse ramp voltage and the fine ramp voltage is improved.

Moreover, in accordance with an embodiment of the present invention, it is possible to generate a digital signal corresponding to a proper code in converting an analog signal to a digital signal.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Hereinafter, a ramp voltage generator and an image sensing device including the same in accordance with an embodiment of the present Invention will be described in more detail.

Figure 3:
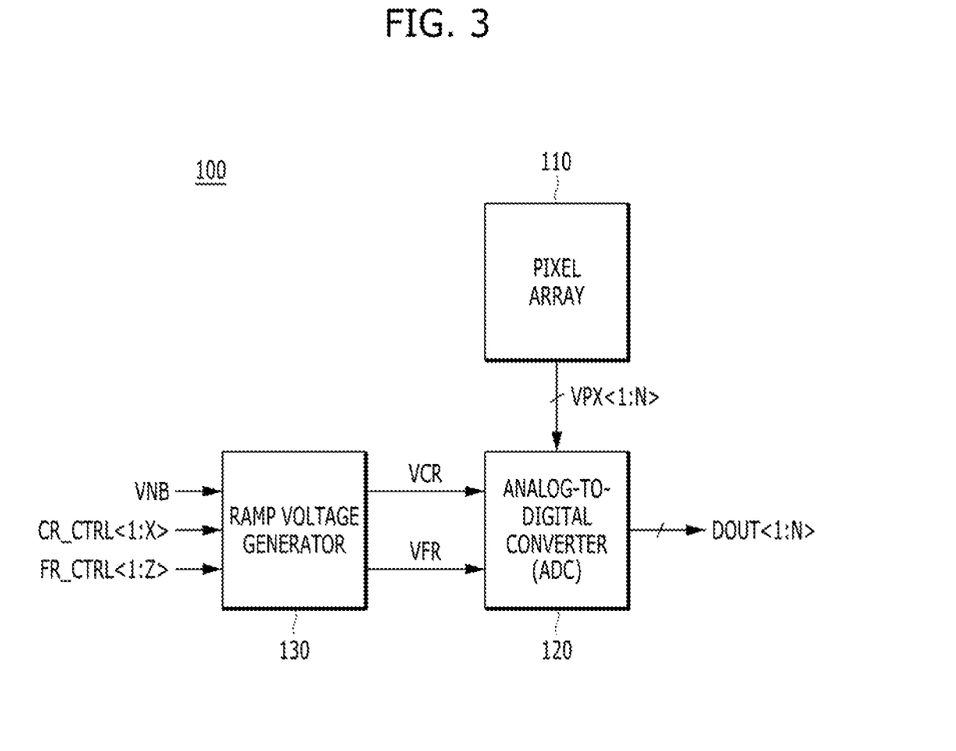
FIG. 3 is a block configuration diagram of an image sensing device in accordance with an embodiment of the present invention.

FIG. 3 illustrates a block configuration diagram of an image sensing device in accordance with an embodiment of the present invention.

Referring to FIG. 3, an image sensing device 100 may include a pixel array 110, an analog-to-digital converter (ADC) 120, and a ramp voltage generator 130.

The pixel array 110 may include N×M pixels (not illustrated) arranged in a row direction and a column direction (N and M being natural numbers). The pixel array 110 may sequentially output first to $N^{th}$ pixel signals VPX<1:N> in units of rows M times.

The analog-to-digital converter 120 may generate first to $N^{th}$ digital signals DOUT<1:N> corresponding to the first to $N^{th}$ pixel signals VPX<1:N> by using a coarse ramp voltage VCR and a fine ramp voltage VFR. For example, the analog-to-digital converter 120 may include a 2-step ADC.

The ramp voltage generator 130 may generate the coarse ramp voltage VCR having a first slope and the fine ramp voltage VFR having a second slope corrected based on the first slope in response to a first bias signal VNB, first to $X^{th}$ coarse ramp control signals CR_CTRL<1:X>, and first to $Z^{th}$ fine ramp control signals FR_CTRL<1:Z>.

Figure 4:
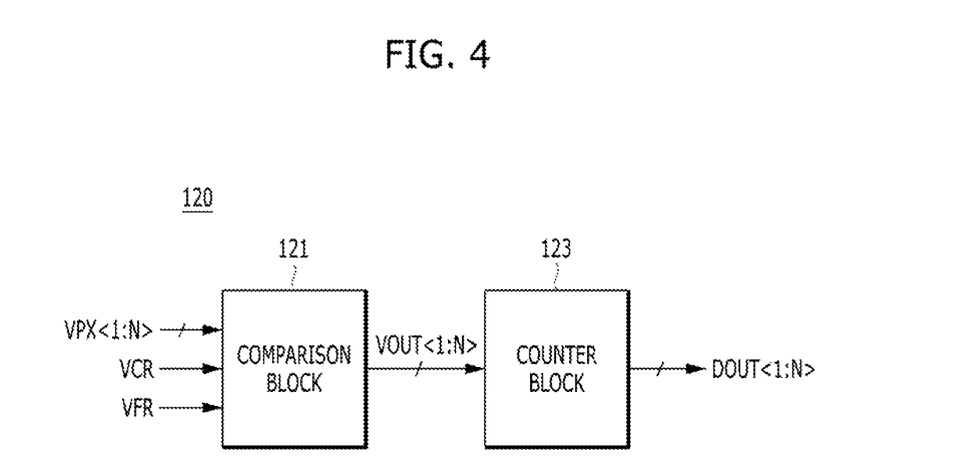
FIG. 4 is a block configuration diagram of an analog-to-digital converter illustrated in FIG. 3.

FIG. 4 illustrates a block configuration diagram of the analog-to-digital converter 120 illustrated in FIG. 3.

Referring to FIG. 4, the analog-to-digital converter 120 may include a comparison block 121 and a counter block 123.

The comparison block 121 may include first to $N^{th}$ comparison units (not illustrated) corresponding to the first to $N^{th}$ pixel signals VPX<1:N>. The first to $N^{th}$ comparison units may respectively receive the first to $N^{th}$ pixel signals VPX<1:N>, and receive the coarse ramp voltage VCR and the fine ramp voltage VFR in common. The first to $N^{th}$ comparison units may compare respective pixel signals with the coarse ramp voltage VCR during a coarse conversion period, compare the respective pixel signals with the fine ramp voltage VFR during a fine conversion period, and generate first to $N^{th}$ comparison result signals VOUT<1:N> based on comparison results during the coarse and fine conversion periods. For example, the first comparison unit may compare the first pixel signal VPX<1> with the coarse ramp voltage VCR, and may perform zero crossing for the first comparison result signal VOUT<1> when the first pixel signal VPX<1> is substantially equal to the coarse ramp voltage VCR as a result of the comparison. Based on the comparison result of the first pixel signal VPX<1> and the coarse ramp voltage VCR, the first comparison unit may compare the first pixel signal VPX<1> with the fine ramp voltage VFR, and may perform zero crossing for the first comparison result signal VOUT<1> again when the first pixel signal VPX<1> is substantially equal to the fine ramp voltage VFR as a result of the comparison.

The counter block 123 may include first to $N^{th}$ counting units (not illustrated) corresponding to the first to $N^{th}$ comparison result signals VOUT<1:N>. The first to $N^{th}$ counting units may count the first to $N^{th}$ comparison result signals VOUT<1:N>, and generate the first to $N^{th}$ digital signals DOUT<1:N> corresponding to the counting result. For example, the first counting unit may count a coarse clock (not illustrated) for a period before the first comparison result signal VOUT<1> is subjected to first zero crossing during the coarse conversion period, count a fine clock (not illustrated) for a period before the first comparison result signal VOUT<1> is subjected to second zero crossing during the fine conversion period, and generate the first digital signal DOUT<1> based on counting results.

Figure 5:
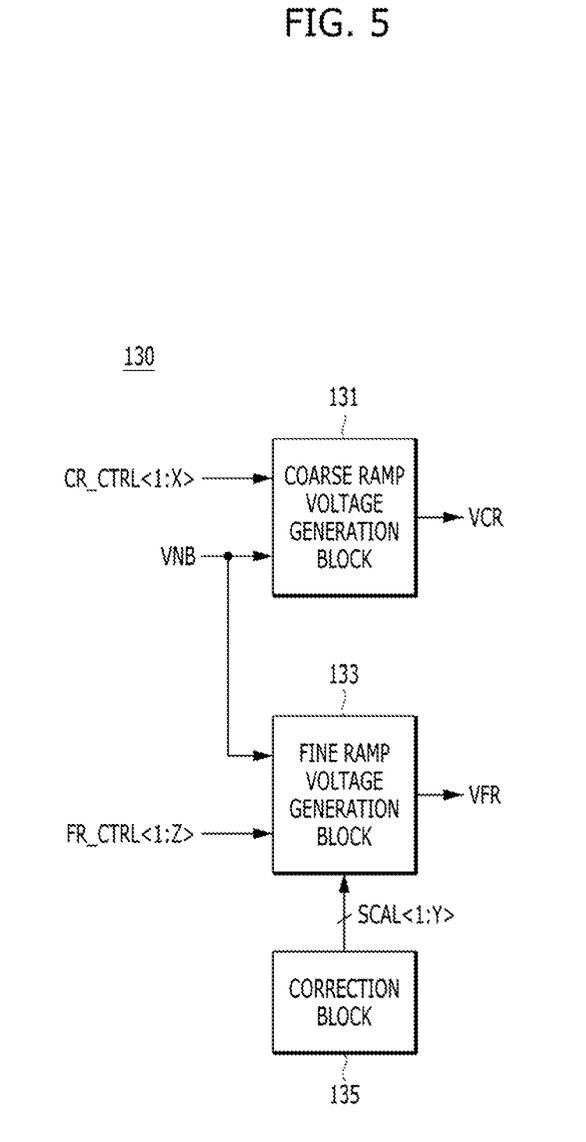
FIG. 5 is a block configuration diagram of a ramp voltage generator illustrated in FIG. 3.

FIG. 5 illustrates a block configuration diagram of the ramp voltage generator 130 illustrated in FIG. 3.

Referring to FIG. 5, the ramp voltage generator 130 may include a coarse ramp voltage generation block 131, a fine ramp voltage generation block 133, and a correction block 135.

The coarse ramp voltage generation block 131 may generate the coarse ramp voltage VCR in response to the first bias signal VNB and the first to $X^{th}$ coarse ramp control signals CR_CTRL<1:X>. For example, the coarse ramp voltage generation block 131 may generate the coarse ramp voltage VCR in response to the coarse clock during the coarse conversion period, where the voltage level of the coarse ramp voltage VCR drops by 128 LSB.

The fine ramp voltage generation block 133 may generate the fine ramp voltage VFR in response to the first bias signal VNB, first to $Z^{th}$ fine ramp control signals FR_CTRL<1:Z>, and first to $Y^{th}$ slope correction signals SCAL<1:Y>. For example, the fine ramp voltage generation block 133 may generate the fine ramp voltage VFR in response to the fine clock during the fine conversion period, where the voltage level of the fine ramp voltage VFR rises by 1 LSB.

The correction block 135 may store the first to $Y^{th}$ slope correction signals SCAL<1:Y> previously set by a user. For example, the correction block 135 may include a register, a fuse circuit and the like.

Figure 6:
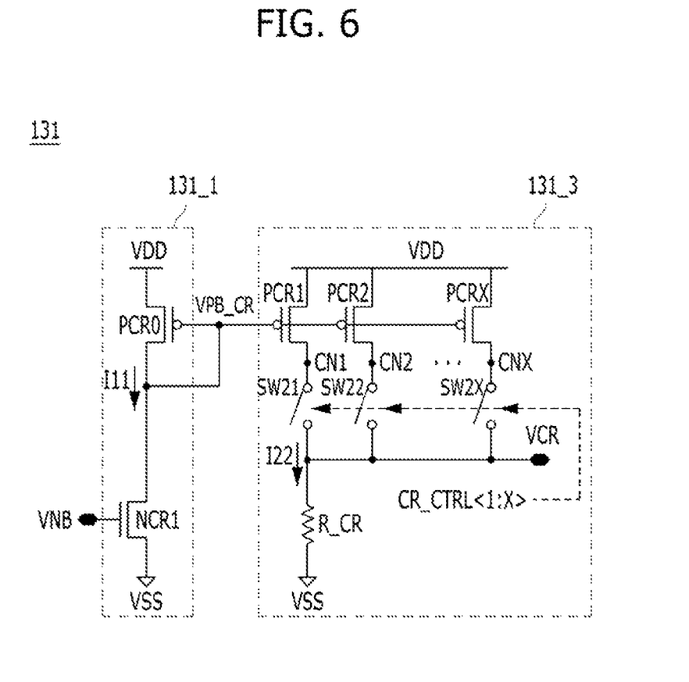
FIG. 6 is an internal configuration diagram of a coarse ramp voltage generation block illustrated in FIG. 5.

FIG. 6 illustrates an internal configuration diagram of the coarse ramp voltage generation block 131 illustrated in FIG. 5.

Referring to FIG. 6, the coarse ramp voltage generation block 131 may include a first source current generation unit 131_1 and a coarse ramp voltage generation unit 131_3.

The first source current generation unit 131_1 may generate a first source current I11 in response to the first bias signal VNB, and generate a second bias signal VPB_CR corresponding to the first source current I11.

For example, the first source current generation unit 131_1 may include a first sinking section NCR1 and a first sourcing section PCR0. The first sinking section NCR1 may be coupled between an output terminal of the second bias signal VPB_CR and a ground voltage terminal VSS, and may make the first source current I11 sink to the ground voltage terminal VSS in response to the first bias signal VNB. For example, the first sinking section NCR1 may include a NMOS transistor having a gate coupled to an input terminal of the first bias signal VNB and a drain and a source coupled between the output terminal of the second bias signal VPB_CR and the ground voltage terminal VSS. The first sourcing section PCR0 may be coupled between a power supply voltage terminal VDD and the output terminal of the second bias signal VPB_CR, and may make the first source current I11 sourced from the power supply voltage terminal VDD in response to the second bias signal VPB_CR. For example, the first sourcing section PCR0 may include a PMOS transistor having a gate and a drain coupled to the output terminal of the second bias signal VPB_CR and a source coupled to the power supply voltage terminal VDD.

The coarse ramp voltage generation unit 131_3 may generate a first mirror current I22 varied by a coarse unit (which may correspond to 128 LSB) in response to the second bias signal VPB_CR and the first to $X^{th}$ coarse ramp control signals CR_CTRL<1:X>, and generate the coarse ramp voltage VCR based on the first mirror current I22.

For example, the coarse ramp voltage generation unit 131_3 may include a first mirroring section PCR1 to PCRX, a first switching section SW21 to SW2X, and a first resistor section R_CR. The first mirroring section PCR1 to PCRX is coupled between the power supply voltage terminal VDD and first to $X^{th}$ mirroring nodes CN1 to CNX, and resources the first mirror current I22 in response to the second bias signal VPB_CR. For example, the first mirroring section PCR1 to PCRX includes first to $X^{th}$ PMOS transistors respectively having gates coupled to an input terminal of the second bias signal VPB_CR and sources and drains coupled between the power supply voltage terminal VDD and the first to $X^{th}$ mirroring nodes CN1 to CNX. The first switching section SW21 to SW2X may be coupled between the first to $X^{th}$ mirroring nodes CN1 to CNX and an output terminal of the coarse ramp voltage VCR, and may generate the first mirror current I22 decreased by the coarse unit during the coarse conversion period in response to the first to $X^{th}$ coarse ramp control signals CR_CTRL<1:X>. For example, the first switching section SW21 to SW2X may include first to $X^{th}$ switching elements which sequentially open during the coarse conversion period in response to the first to $X^{th}$ coarse ramp control signals CR_CTRL<1:X>. The first resistor section R_CR may be coupled between the output terminal of the coarse ramp voltage VCR and the ground voltage terminal VSS. For example, the first resistor section R_CR may include a resistance element.

Figure 7:
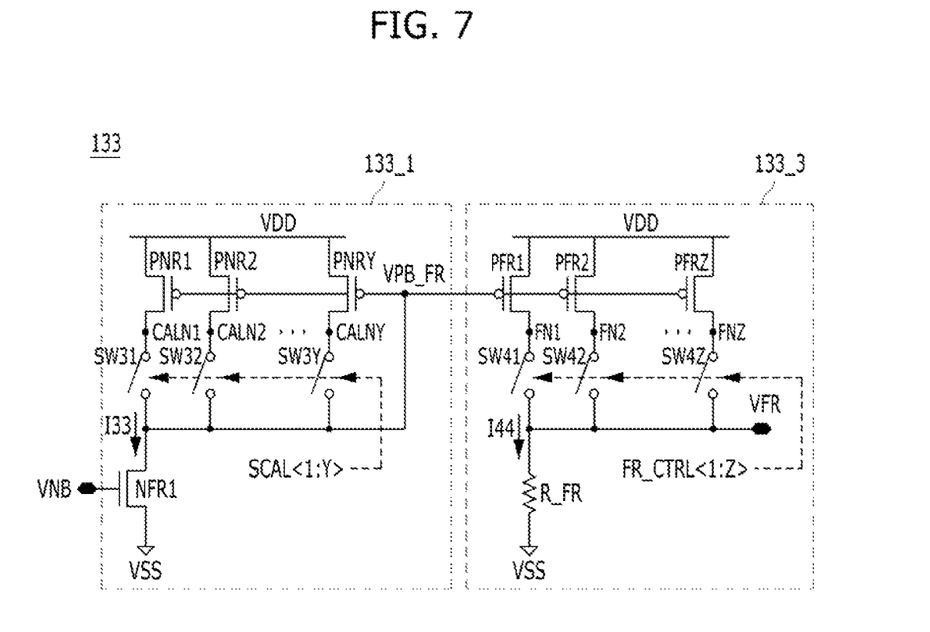
FIG. 7 is an internal configuration diagram of a fine ramp voltage generation block illustrated in FIG. 5.

FIG. 7 illustrates an internal configuration diagram of the fine ramp voltage generation block 133 illustrated in FIG. 5.

Referring to FIG. 7, the fine ramp voltage generation block 133 may include a second source current generation unit 133_1 and a fine ramp voltage generation unit 133_3.

The second source current generation unit 133_1 may generate a second source current I33 corrected based on the first slope in response to the first bias signal VNB and the first to $Y^{th}$ slope correction signals SCAL<1:Y>, and generate a third bias signal VPB_FR corresponding to the second source current I33.

For example, the second source current generation unit 133_1 may include a second sinking section NFR1, a second sourcing section PNR1 to PNRY, and a second switching section SW31 to SW3Y. The second sinking section NFR1 may be coupled between an output terminal of the third bias signal VPB_FR and the ground voltage terminal VSS, and may make the second source current I33 sink to the ground voltage terminal VSS in response to the first bias signal VNB. For example, the second sinking section NFR1 may include a NMOS transistor having a gate coupled to the input terminal of the first bias signal VNB and a drain and a source coupled between the output terminal of the third bias signal VPB_FR and the ground voltage terminal VSS. The second sourcing section PNR1 to PNRY may be coupled between the power supply voltage terminal VDD and first to $Y^{th}$ sourcing nodes CALN1 to CALNY, and may make the second source current I33 sourced from the power supply voltage terminal VDD in response to the third bias signal VPB_FR. For example, the second sourcing section PNR1 to PNRY may include first to $Y^{th}$ PMOS transistors respectively having gates coupled to the output terminal of the third bias signal VPB_FR and sources and drains coupled between the power supply voltage terminal VDD and the first to $Y^{th}$ sourcing nodes CALN1 to CALNY. The second switching section SW31 to SW3Y may include first to $Y^{th}$ switching elements coupled between the respective first to $Y^{th}$ sourcing nodes CALN1 to CALNY and the output terminal of the third bias signal VPB_FR, and selectively switched in response to the first to $Y^{th}$ slope correction signals SCAL<1:Y>.

The fine ramp voltage generation unit 133_3 may generate a second mirror current I44 varied by a fine unit (which may correspond to 1 LSB) in response to the third bias signal VPB_FR and the first to $Z^{th}$ fine ramp control signals FR_CTRL<1:Z>, and generate the fine ramp voltage VFR based on the second mirror current I44.

For example, the fine ramp voltage generation unit 133_3 may include a second mirroring section PFR1 to PFRZ, a third switching section SW41 to SW4Z, and a second resistor section R_FR. The second mirroring section PFR1 to PFRZ may be coupled between the power supply voltage terminal VDD and first to $Z^{th}$ mirroring nodes FN1 to FNZ, and may resource the second mirror current I44 in response to the third bias signal VPB_FR. For example, the second mirroring section PFR1 to PFRZ may include first to $Z^{th}$ PMOS transistors respectively having gates coupled to an input terminal of the third bias signal VPB_FR and sources and drains coupled between the power supply voltage terminal VDD and the first to $Z^{th}$ mirroring nodes FN1 to FNZ. The third switching section SW41 to SW4Z may be coupled between the first to $Z^{th}$ mirroring nodes FN1 to FNZ and an output terminal of the fine ramp voltage VFR, and may generate the second mirror current I44 increased by the fine unit during the fine conversion period in response to the first to $Z^{th}$ fine ramp control signals FR_CTRL<1:Z>. For example, the third switching section SW41 to SW4Z may include first to $Z^{th}$ switching elements which are sequentially closed during the fine conversion period in response to the first to $Z^{th}$ fine ramp control signals FR_CTRL<1:Z>. The second resistor section R_FR may be coupled between the output terminal of the fine ramp voltage VFR and the ground voltage terminal VSS. For example, the second resistor section R_FR may include a resistance element.

Hereinafter, the operation of the image sensing device 100 having the aforementioned configuration in accordance with the embodiment of the present invention will be described.

In the embodiment of the present invention, the general operation of the image sensing device 100 for the first pixel signal VPX<1> will be described with reference with FIG. 8 and FIG. 9.

Figure 8:
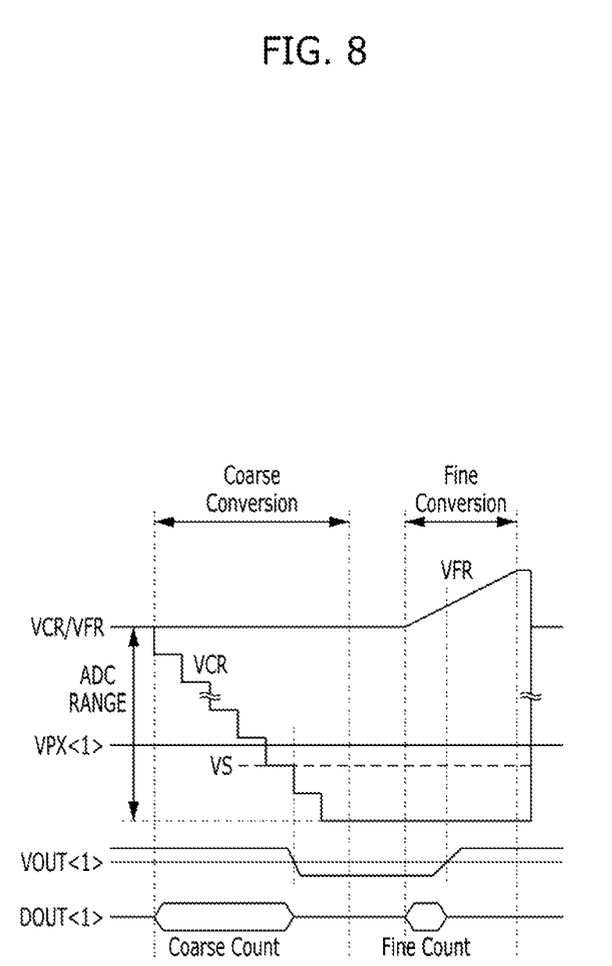
FIG. 8 is a timing diagram for explaining the operation of an image sensing device illustrated in FIG. 3.
Figure 9:
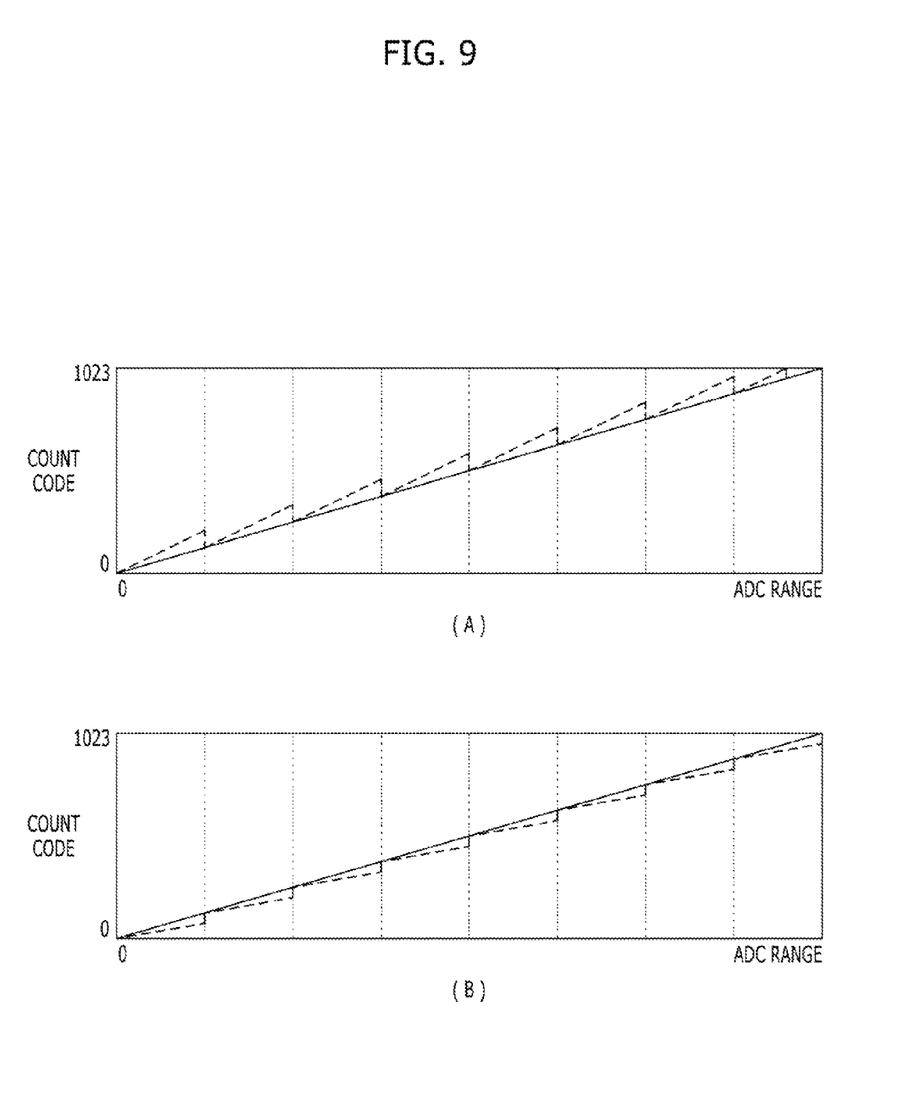
FIG. 9 is a graph for explaining the improvement of a ramp voltage generator illustrated in FIG. 5.

FIG. 8 illustrates a timing diagram for explaining the operation of the image sensing device 100 in accordance with the embodiment of the present invention, and FIG. 9 illustrates a graph for explaining how the linearity of digital signals (for example, DOUT<1>) outputted from the analog-to-digital converter 120 is improved as the slope of the fine ramp voltage VFR is corrected.

The first to $Y^{th}$ slope correction signals SCAL<1:Y> may be set in advance in the correction block 135. For example, the slope of the fine ramp voltage VFR may be measured through a test or a simulation, and the first to $Y^{th}$ slope correction signals SCAL<1:Y> corresponding to the measurement result may be set in advance in the correction block 135 by a user.

In such a state, referring to FIG. 8, the analog-to-digital converter 120 may measure a voltage level of the first pixel signal VPX<1> outputted from the pixel array 110 based on the coarse ramp voltage VCR during the coarse conversion period, and generate the first digital signal DOUT<1> corresponding to the measurement result. For example, the comparison block 121 may compare the voltage level of the first pixel signal VPX<1> with the coarse ramp voltage VCR with a voltage level dropping by the coarse unit (for example, 128 LSB), and perform zero crossing for the first comparison result signal VOUT<1> when the voltage level of the coarse ramp voltage VCR is lower than the voltage level of the first pixel signal VPX<1> as a result of the comparison. Furthermore, the counter block 123 may count a coarse clock (not illustrated) for a period before the first comparison result signal VOUT<1> is subjected to zero crossing during the coarse conversion period, and generate a count code of 3 bits corresponding to the counting result as the first digital signal DOUT<1>.

Subsequently, the analog-to-digital converter 120 may measure the voltage level of the first pixel signal VPX<1> based on the fine ramp voltage VFR during the fine conversion period, and generate the first digital signal DOUT<1> corresponding to the measurement result. For example, the comparison block 121 may compare the voltage level of the first pixel signal VPX<1> with the fine ramp voltage VFR with a voltage level rising by the fine unit (for example, 1 LSB), and perform zero crossing for the first comparison result signal VOUT<1> when the voltage level of the fine ramp voltage VFR is higher than the voltage level of the first pixel signal VPX<1> as a result of the comparison. The comparison block 121 may store the level VS of the coarse ramp voltage VCR when it is lower than the voltage level of the first pixel signal VPX<1> in the coarse conversion period, and compare the fine ramp voltage VFR rising by the fine unit from the level VS with the voltage level of the first pixel signal VPX<1>. Furthermore, the counter block 123 may count a fine clock (not illustrated) for a period before the first comparison result signal VOUT<1> is subjected to zero crossing during the fine conversion period, and generate a count code of 7 bits corresponding to the counting result as the first digital signal DOUT<1>.

The ramp voltage generator 130 may generate the coarse ramp voltage VCR with a voltage level dropping by the coarse unit in response to the first to $X^{th}$ coarse ramp control signals CR_CTRL<1:X> during the coarse conversion period, and generate the fine ramp voltage VFR with a voltage level rising by the fine unit in response to the first to $Z^{th}$ fine ramp control signals FR_CTRL<1:Z> during the fine conversion period. Particularly, the ramp voltage generator 130 may generate the fine ramp voltage VFR with a corrected slop in response to the first to $Y^{th}$ slope correction signals SCAL<1:Y> to correspond to the slope of the coarse ramp voltage VCR, during the fine conversion period. The operation of the ramp voltage generator 130 will be described in more detail below.

The coarse ramp voltage generation block 131 may generate the coarse ramp voltage VCR with a voltage level dropping by the coarse unit in response to the first bias signal VNB and the first to $X^{th}$ coarse ramp control signals CR_CTRL<1:X> during the coarse conversion period.

For example, the first sinking section NCR1 may make the first source current I11 sink to the ground voltage terminal VSS in response to the first bias signal VNB, and the first sourcing section PCR0 may make the first source current I11 sourced from the power supply voltage terminal VDD in response to the second bias signal VPB_CR. The first mirroring section PCR1 to PCRX may make the first mirror current I22 sourced from the power supply voltage terminal VDD in response to the second bias signal VPB_CR, and the first to $X^{th}$ switching elements included in the first switching section SW21 to SW2X may sequentially open during the coarse conversion period in response to the first to $X^{th}$ coarse ramp control signals CR_CTRL<1:X>, and may generate the first mirror current I22 sequentially decreased by the coarse unit. The coarse ramp voltage VCR with a voltage level dropping by the coarse unit in correspondence to the first mirror current I22 may then be generated.

Next, the fine ramp voltage generation block 133 may generate the fine ramp voltage VFR with a voltage level rising by the fine unit in response to the first bias signal VNB, the first to $Z^{th}$ fine ramp control signals FR_CTRL<1:Z>, and the first to $Y^{th}$ slope correction signals SCAL<1:Y> during the fine conversion period.

For example, the second sinking section NFR1 may sink the second source current I33 to the ground voltage terminal VSS in response to the first bias signal VNB, and the second sourcing section PNR1 to PNRY may generate the second source current I33 sourced from the power supply voltage VDD in response to the third bias signal VPB_FR. The first to $Y^{th}$ switching elements included in the second switching section SW31 to SW3Y may then be selectively opened or closed in response to the preset first to $Y^{th}$ slope correction signals SCAL<1:Y>, and may correct the voltage level of the third bias signal VPB_FR. As illustrated in a graph (A) of FIG. 9, when the slope of the fine ramp voltage VFR is higher than the slope of the coarse ramp voltage VCR, the number of switching elements closed among the first to $Y^{th}$ switching elements is increased, so that the voltage level of the third bias signal VPB_FR may be corrected to be increased. Thus, a unit current amount (corresponding to an amount of current flowing through each the first to $Z^{th}$ mirroring nodes FN1 to FNZ) of the second mirror current I44 is reduced, so that the slope of the fine ramp voltage VFR may be corrected to be low. However, as illustrated in a graph (B) of FIG. 9, when the slope of the fine ramp voltage VFR is lower than the slope of the coarse ramp voltage VCR, the number of switching elements open among the first to $Y^{th}$ switching elements is increased, so that the voltage level of the third bias signal VPB_FR may be corrected to be dropped. Thus, the unit current amount of the second mirror current I44 is increased, so that the slope of the fine ramp voltage VFR may be corrected to be high.

The second mirroring section PFR1 to PFRZ may cake the second mirror current I44 sourced from the power supply voltage terminal VDD in response to the third bias signal VPB_FR, and the first to $Z^{th}$ switching elements included in the third switching section SW41 to SW4Z may be sequentially closed during the fine conversion period in response to the first to $Z^{th}$ fine ramp control signals FR_CTRL<1:Z>, and may generate the second mirror current I44 sequentially increased by the fine unit. At this time, the fine ramp voltage VFR with a voltage level rising by the fine unit in correspondence to the second mirror current I44 may be generated.

In accordance with the embodiment of the present invention as described above, the voltage level of the third bias signal VPB_FR required for generating the fine ramp voltage VFR is adjusted and thus the slope of the fine ramp voltage VFR and the slope of the coarse ramp voltage VCR are identical so that it is possible to correct a mismatch between the coarse ramp voltage VCR and the fine ramp voltage VFR.

Although various embodiments have been described for illustrative purposes, it will be apparent to those skilled in the art that various changes and modifications may be made without departing from the spirit and scope of the invention as defined in the following claims.

For example, in the embodiments of the present invention, the fine ramp voltage is corrected; however, the present invention is not limited thereto, and the coarse ramp voltage may be corrected.

Furthermore, in the embodiments of the present invention, the second sourcing section is controlled to correct the slope of the fine ramp voltage; however, the present invention is not limited thereto, and the second sinking section may be controlled to correct the slope of the fine ramp voltage.

Furthermore, in the embodiments of the present invention, an image sensing device has been described as an example; however, the present invention is not limited thereto, and the present invention can be applied to all devices and circuits using a coarse ramp voltage and a fine ramp voltage.

What is claimed is:

1. A ramp voltage generator comprising:
    a first ramp voltage generation block suitable for generating a first ramp voltage with a first slope in response to a bias signal and a first ramp control signal; and
    a second ramp voltage generation block suitable for generating a second ramp voltage with a second slope corresponding to the first slope in response to the bias signal, a second ramp control signal, and a slope correction signal,
    wherein the second slope is equal to the first slope.

2. The ramp voltage generator of claim 1, further comprising:
    a correction block suitable for storing the slope correction signal.

3. The ramp voltage generator of claim 1, wherein the first ramp control signal is generated based on a first clock, and the second ramp control signal is generated based on a second clock that has a higher frequency than that of the first clock.

4. The ramp voltage generator of claim 1, wherein the first ramp voltage generation block generates the first ramp voltage during a first conversion period, and the second ramp voltage generation block generates the second ramp voltage during a second conversion period which is different from the first conversion period.

5. A ramp voltage generator comprising:
    a first source current generation unit suitable for generating a first source current in response to a first bias signal, and generating a second bias signal corresponding to the first source current;
    a first ramp voltage generation unit suitable for generating a first mirror current that is varied by a coarse unit in response to the second bias signal and a coarse ramp control signal, and generating a coarse ramp voltage having a first slope based on the first mirror current;
    a second source current generation unit suitable for generating a second source current that is corrected based on the first slope in response to the first bias signal and a slope correction signal, and generating a third bias signal corresponding to the second source current; and
    a second ramp voltage generation unit suitable for generating a second mirror current that is varied by a fine unit in response to the third bias signal and a fine ramp control signal, and generating a fine ramp voltage having the first slope based on the second mirror current.

6. The ramp voltage generator of claim 5, wherein the second source current generation unit comprises:
    a second sinking section coupled between an output terminal of the third bias signal and a ground voltage terminal, wherein the second source current sinks to the ground voltage terminal in response to the first bias signal;
    a plurality of second sourcing sections coupled between a power supply voltage terminal and a plurality of second sourcing nodes, respectively, wherein the second source current is sourced from the power supply voltage terminal in response to the third bias signal; and
    a plurality of second switching sections coupled between the plurality of second sourcing nodes, respectively, and the output terminal of the third bias signal, and suitable for being selectively switched in response to the slope correction signal.

7. The ramp voltage generator of claim 5, wherein the second ramp voltage generation unit comprises:
    a second mirroring section coupled between a power supply voltage terminal and a plurality of second mirroring nodes, wherein the second source current is sourced from the power supply voltage terminal in response to the third bias signal;
    a third switching section coupled between the plurality of second mirroring nodes and an output terminal of the fine ramp voltage, and suitable for being sequentially switched in response to the fine ramp control signal; and
    a second resistor section coupled between the output terminal of the fine ramp voltage and a ground voltage terminal.

8. The ramp voltage generator of claim 5, further comprising:
    a storage unit suitable for storing the slope correction signal.

9. The ramp voltage generator of claim 5, wherein the first source current generation unit comprises:
    a first sinking section coupled between an output terminal of the second bias signal and a ground voltage terminal, wherein the first source current sinks to the ground voltage terminal in response to the first bias signal; and
    a first sourcing section coupled between a power supply voltage terminal and the output terminal of the second bias signal, wherein the first source current is sourced from the power supply voltage terminal in response to the second bias signal.

10. The ramp voltage generator of claim 5, wherein the first ramp voltage generation unit comprises:
    a first mirroring section coupled between a power supply voltage terminal and a plurality of first mirroring nodes, wherein the first source current is sourced from the power supply voltage terminal in response to the second bias signal;
    a first switching section coupled between the plurality of first mirroring nodes and an output terminal of the coarse ramp voltage, and suitable for being sequentially switched in response to the coarse ramp control signal; and
    a first resistor section coupled between the output terminal of the coarse ramp voltage and a ground voltage terminal.

11. The ramp voltage generator of claim 5, wherein the coarse ramp control signal is generated based on a first clock, and the fine ramp control signal is generated based on a second clock with a frequency that is higher than that of the first clock.

12. An image sensing device comprising:
a pixel array suitable for generating a plurality of pixel signals;
an analog-to-digital converter suitable for generating a plurality of digital signals corresponding to the plurality of pixel signals by using a coarse ramp voltage and a fine ramp voltage in common for each of the plurality of pixel signals; and
a ramp voltage generator suitable for generating the coarse ramp voltage having a first slope and the fine ramp voltage having a second slope that is corrected based on the first slope in response to a bias signal, a coarse ramp control signal, and a fine ramp control signal.

13. The image sensing device of claim 12, wherein the second slope is equal to the first slope.

14. The image sensing device of claim 12, wherein the ramp voltage generator comprises:
a correction block suitable for storing a slope correction signal;
a first ramp voltage generation block suitable for generating the coarse ramp voltage in response to the bias signal and the coarse ramp control signal; and
a second ramp voltage generation block suitable for generating the fine ramp voltage in response to the bias signal, the fine ramp control signal, and the slope correction signal.

15. The image sensing device of claim 14, wherein the second ramp voltage generation block comprises:
a second source current generation unit suitable for generating a second source current corrected based on the first slope in response to a first bias signal and the slope correction signal, and generating a third bias signal corresponding to the second source current; and
a second ramp voltage generation unit suitable for generating a second mirror current that is varied by a fine unit in response to the third bias signal and the fine ramp control signal, and generating the fine ramp voltage based on the second mirror current.

16. The image sensing device of claim 15, wherein the second source current generation unit comprises:
a second sinking section coupled between an output terminal of the third bias signal and a ground voltage terminal, wherein the second source current sinks to the ground voltage terminal in response to the first bias signal;
a plurality of second sourcing sections coupled between a power supply voltage terminal and a plurality of second sourcing nodes, respectively, wherein the second source current is sourced from the power supply voltage terminal in response to the third bias signal; and
a plurality of second switching sections coupled between the plurality of second sourcing nodes, respectively, and the output terminal of the third bias signal, and suitable for being selectively switched in response to the slope correction signal.

17. The image sensing device of claim 15, wherein the second ramp voltage generation unit comprises:
a second mirroring section coupled between a power supply voltage terminal and a plurality of second mirroring nodes, wherein the second source current is sourced from the power supply voltage terminal in response to the third bias signal;
a third switching section coupled between the plurality of second mirroring nodes and an output terminal of the fine ramp voltage, and suitable for being sequentially switched in response to the fine ramp control signal; and
a second resistor section coupled between the output terminal of the fine ramp voltage and a ground voltage terminal.

18. The image sensing device of claim 14, wherein the first ramp voltage generation block comprises:
a first source current generation unit suitable for generating a first source current in response to a first bias signal, and generating a second bias signal corresponding to the first source current; and
a first ramp voltage generation unit suitable for generating a first mirror current that is varied by a coarse unit in response to the second bias signal and the coarse ramp control signal, and generating the coarse ramp voltage based on the first mirror current.

19. The image sensing device of claim 18, wherein the first source current generation unit comprises:
a first sinking section coupled between an output terminal of the second bias signal and a ground voltage terminal, wherein the first source current sinks to the ground voltage terminal in response to the first bias signal; and
a first sourcing section coupled between a power supply voltage terminal and the output terminal of the second bias signal, wherein the first source current is sourced from the power supply voltage terminal in response to the second bias signal.

20. The image sensing device of claim 18, wherein the first ramp voltage generation unit comprises:
a first mirroring section coupled between a power supply voltage terminal and a plurality of first mirroring nodes, wherein the first source current is sourced from the power supply voltage terminal in response to the second bias signal;
a first switching section coupled between the plurality of first mirroring nodes and an output terminal of the coarse ramp voltage, and suitable for being sequentially switched in response to the coarse ramp control signal; and
a first resistor section coupled between the output terminal of the coarse ramp voltage and a ground voltage terminal.

* * * * *